(12) United States Patent
Li et al.

(10) Patent No.: US 12,477,919 B2
(45) Date of Patent: Nov. 18, 2025

(54) DISPLAY PANEL, ELECTRONIC DEVICE, AND METHOD OF MANUFACTURING DISPLAY PANEL

(71) Applicant: BOE Technology Group Co., Ltd., Beijing (CN)

(72) Inventors: Xiang Li, Beijing (CN); Shi Shu, Beijing (CN); Chuanxiang Xu, Beijing (CN); Yong Yu, Beijing (CN); Yang Yue, Beijing (CN); Haitao Huang, Beijing (CN); Wei Huang, Beijing (CN); Yujie Liu, Beijing (CN); Wei He, Beijing (CN); Qi Yao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 719 days.

(21) Appl. No.: 17/788,849

(22) PCT Filed: Aug. 4, 2021

(86) PCT No.: PCT/CN2021/110588
§ 371 (c)(1),
(2) Date: Jun. 24, 2022

(87) PCT Pub. No.: WO2022/062693
PCT Pub. Date: Mar. 31, 2022

(65) Prior Publication Data
US 2023/0060696 A1   Mar. 2, 2023

(30) Foreign Application Priority Data

Sep. 27, 2020   (CN) .......................... 202011037370.4

(51) Int. Cl.
*H10K 59/38*   (2023.01)
*H10K 50/858*   (2023.01)
(Continued)

(52) U.S. Cl.
CPC .......... *H10K 59/38* (2023.02); *H10K 50/858* (2023.02); *H10K 50/865* (2023.02);
(Continued)

(58) Field of Classification Search
CPC .... H10K 59/38; H10K 50/858; H10K 50/865; H10K 59/879; H10K 71/00; H10K 77/00;
(Continued)

(56) References Cited

U.S. PATENT DOCUMENTS

2019/0203904 A1\* 7/2019 Lee .................... H10H 20/8516
2019/0363107 A1 11/2019 Matsusaki et al.
(Continued)

FOREIGN PATENT DOCUMENTS

| CN | 111108602 A | 5/2020 |
|---|---|---|
| CN | 111146248 A | 5/2020 |

(Continued)

*Primary Examiner* — Mohammad A Rahman
(74) *Attorney, Agent, or Firm* — WHDA, LLP

(57) ABSTRACT

The embodiments of the present disclosure provide a display panel, including: a base substrate, a first electrode layer, a luminescent material layer, a second electrode layer, an elastic lens layer and at least one light wavelength conversion layer arranged in sequence. The luminescent material layer is configured to emit an excitation light, the at least one light wavelength conversion layer is configured to convert the excitation light emitted from the luminescent material layer into light of a predetermined color, and the elastic lens layer is configured to converge the excitation light emitted from the luminescent material layer. The embodiments of the present disclosure further provide an electronic device and a method of manufacturing a display panel.

18 Claims, 8 Drawing Sheets

(51) Int. Cl.
  *H10K 50/86* (2023.01)
  *H10K 59/80* (2023.01)
  *H10K 71/00* (2023.01)
  *H10K 77/00* (2023.01)
(52) U.S. Cl.
  CPC ........... *H10K 59/879* (2023.02); *H10K 71/00* (2023.02); *H10K 77/00* (2023.02); *H10K 59/8723* (2023.02); *H10K 59/8792* (2023.02)
(58) Field of Classification Search
  CPC ........... H10K 59/8723; H10K 59/8792; H10K 59/1201
  See application file for complete search history.

(56) References Cited

U.S. PATENT DOCUMENTS

| | | | |
|---|---|---|---|
| 2020/0039157 A1* | 2/2020 | Yoshimura | B29C 45/14778 |
| 2020/0144333 A1 | 5/2020 | Kim et al. | |
| 2022/0336780 A1 | 10/2022 | Sun et al. | |

FOREIGN PATENT DOCUMENTS

| | | | |
|---|---|---|---|
| CN | 111653683 A | 9/2020 | |
| CN | 212517209 U | 2/2021 | |

\* cited by examiner

US 12,477,919 B2

DISPLAY PANEL, ELECTRONIC DEVICE, AND METHOD OF MANUFACTURING DISPLAY PANEL

CROSS-REFERENCE TO RELATED APPLICATIONS

This application is a Section 371 National Stage Application of International Application No. PCT/CN2021/110588 filed on Aug. 4, 2021, which claims priority to Chinese patent Application No. 202011037370.4, filed on Sep. 27, 2020, the content of which is incorporated herein by reference in their entirety.

TECHNICAL FIELD

The present disclosure relates to a field of a display technology, and in particular to a display panel, an electronic device including the display panel, and a method of manufacturing a display panel.

BACKGROUND

A quantum dot display technology is one of hot spots in display technologies. In a solution of a large-scale display device, the quantum dot display technology and an organic light emitting diode display technology are combined in a quantum dot-organic light emitting diode (QD-OLED) display panel, and an organic light emitting diode is used to excite quantum dots to emit light so as to achieve a display. The quantum dot-organic light emitting diode display panel has potential technical advantages such as a high resolution, a high color gamut and a high color purity, and has no viewing angle dependence.

SUMMARY

A display panel is provided, including:
a base substrate;
a first electrode layer arranged on the base substrate;
a luminescent material layer located on a side of the first electrode layer away from the base substrate, wherein the luminescent material layer is configured to emit an excitation light;
a second electrode layer located on a side of the luminescent material layer away from the base substrate; and
at least one light wavelength conversion layer located on a side of the second electrode layer away from the base substrate, wherein the at least one light wavelength conversion layer is configured to convert the excitation light emitted from the luminescent material layer into light of a predetermined color,
wherein the display panel further includes an elastic lens layer located on the side of the second electrode layer away from the base substrate and on a side of the light wavelength conversion layer toward the base substrate, and the elastic lens layer is configured to converge the excitation light emitted from the luminescent material layer.

In some embodiments, the elastic lens layer has an elastic restoring force of 200 MPa to 600 MPa.

In some embodiments, the display panel further includes a thin film encapsulation located between the elastic lens layer and the second electrode layer, a gas or a flexible medium is filled around the elastic lens layer between the thin film encapsulation and the light wavelength conversion layer, and a refractive index of the gas or the flexible medium is less than a refractive index of the elastic lens layer.

In some embodiments, the display panel further includes a protective layer located between the elastic lens layer and the light wavelength conversion layer, wherein a height of the elastic lens layer in a direction perpendicular to the base substrate is equal to a distance from a surface of the protective layer on a side facing the base substrate to a surface of the thin film encapsulation on a side away from the base substrate in the direction perpendicular to the base substrate.

In some embodiments, the at least one light wavelength conversion layer includes a first color light wavelength conversion layer and a second color light wavelength conversion layer, the elastic lens layer includes a first converging lens and a second converging lens, an orthographic projection of the first converging lens on the base substrate at least partially overlaps with an orthographic projection of the first color light wavelength conversion layer on the base substrate, and an orthographic projection of the second converging lens on the base substrate at least partially overlaps with an orthographic projection of the second color light wavelength conversion layer on the base substrate.

In some embodiments, adjacent first color light wavelength conversion layer and second color light wavelength conversion layer are spaced apart by a spacer in a direction parallel to the base substrate.

In some embodiments, an inner angle formed between a side slope surface of the spacer facing the first color light wavelength conversion layer or the second color light wavelength conversion layer and a surface of the spacer on a side facing the base substrate is less than 90 degrees.

In some embodiments, an area of an orthographic projection of the surface of the spacer on the side facing the base substrate on the base substrate is greater than an area of an orthographic projection of a surface of the spacer on a side away from the base substrate on the base substrate.

In some embodiments, a height h of the first converging lens in the direction perpendicular to the base substrate satisfies:

$$h \leq \frac{W}{2 \times \tan\theta 1}$$

wherein W is a sum of a width of the first color light wavelength conversion layer and widths of the spacers on two sides adjacent to the first color light wavelength conversion layer, and θ1 is a predetermined divergence angle of the excitation light emitted from the luminescent material layer.

In some embodiments, the excitation light emitted from the luminescent material layer has a third color, the display panel further includes a third color light transmission layer located on the side of the second electrode layer away from the base substrate and configured to transmit the excitation light, the elastic lens layer further includes a third converging lens, and an orthographic projection of the third converging lens on the base substrate at least partially overlaps with an orthographic projection of the third color light transmission layer on the base substrate.

In some embodiments, the display panel further includes a filter layer located on a side of the at least one light wavelength conversion layer away from the base substrate, wherein the filter layer is configured to filter exit light from the first color light wavelength conversion layer and exit light from the second color light wavelength conversion layer, and the filter layer is a thin film filter.

In some embodiments, the filter layer includes a long pass filter film, an orthographic projection of the long pass filter film on the base substrate covers the orthographic projection of the first color light wavelength conversion layer on the base substrate and the orthographic projection of the second color light wavelength conversion layer on the base substrate, a pass band wavelength range of the long pass filter film at least partially covers a desired exit light wavelength range of the first color light wavelength conversion layer and a desired exit light wavelength range of the second color light wavelength conversion layer, and a stop band wavelength range of the long pass filter film covers a wavelength range of the excitation light emitted from the luminescent material layer.

In some embodiments, the filter layer includes:
a first color filter film, wherein an orthographic projection of the first color filter film on the base substrate covers the orthographic projection of the first color light wavelength conversion layer on the base substrate, and the first color filter film is configured to eliminate light of wavelengths other than a desired exit light wavelength range of the first color light wavelength conversion layer; and
a second color filter film, wherein an orthographic projection of the second color filter film on the base substrate covers the orthographic projection of the second color light wavelength conversion layer on the base substrate, and the second color filter film is configured to eliminate light of wavelengths other than a desired exit light wavelength range of the second color light wavelength conversion layer.

In some embodiments, a surface of one or more of the at least one light wavelength conversion layer on a side away from the base substrate has a shape of a converging lens surface.

In some embodiments, the display panel further includes a color filter cover plate located on a side of the filter layer away from the base substrate.

The embodiments of the present disclosure further provide an electronic device including the display panel described in any of the foregoing embodiments.

The embodiments of the present disclosure further provide a method of manufacturing a display panel, including:
providing a base substrate and sequentially forming a first electrode layer, a luminescent material layer and a second electrode layer on the base substrate to form an array substrate;
providing a color filter cover plate and forming at least one light wavelength conversion layer on the color filter cover plate; and
forming an elastic lens layer on a side of the at least one light wavelength conversion layer away from the color filter cover plate, so as to form a color filter substrate, wherein the elastic lens layer is located on a side of the second electrode layer away from the base substrate and on a side of the light wavelength conversion layer toward the base substrate, and the elastic lens layer is configured to converge an excitation light emitted from the luminescent material layer.

In some embodiments, the method further includes: before forming at least one light wavelength conversion layer,
forming a filter layer on the color filter cover plate; and
forming a plurality of spacers on a side of the filter layer away from the color filter cover plate, wherein an opening region is arranged between the spacers;

wherein the at least one light wavelength conversion layer is formed in the opening region, and adjacent light wavelength conversion layers are spaced apart by the spacers.

In some embodiments, the method further includes: before forming the filter layer,
forming a black matrix layer on the color filter cover plate,
wherein the filter layer is located on a side of the black matrix layer away from the color filter substrate.

In some embodiments, the method further includes:
assembling the color filter substrate and the array substrate to form the display panel.

BRIEF DESCRIPTION OF DRAWINGS

In order to describe the technical solutions in the embodiments of the present disclosure more clearly, the drawings of the embodiments will be briefly introduced below. It should be noted that the drawings in the following descriptions are only some embodiments of the present disclosure, and are not intended to limit the present disclosure.

DETAILED DESCRIPTION

Figure 1:
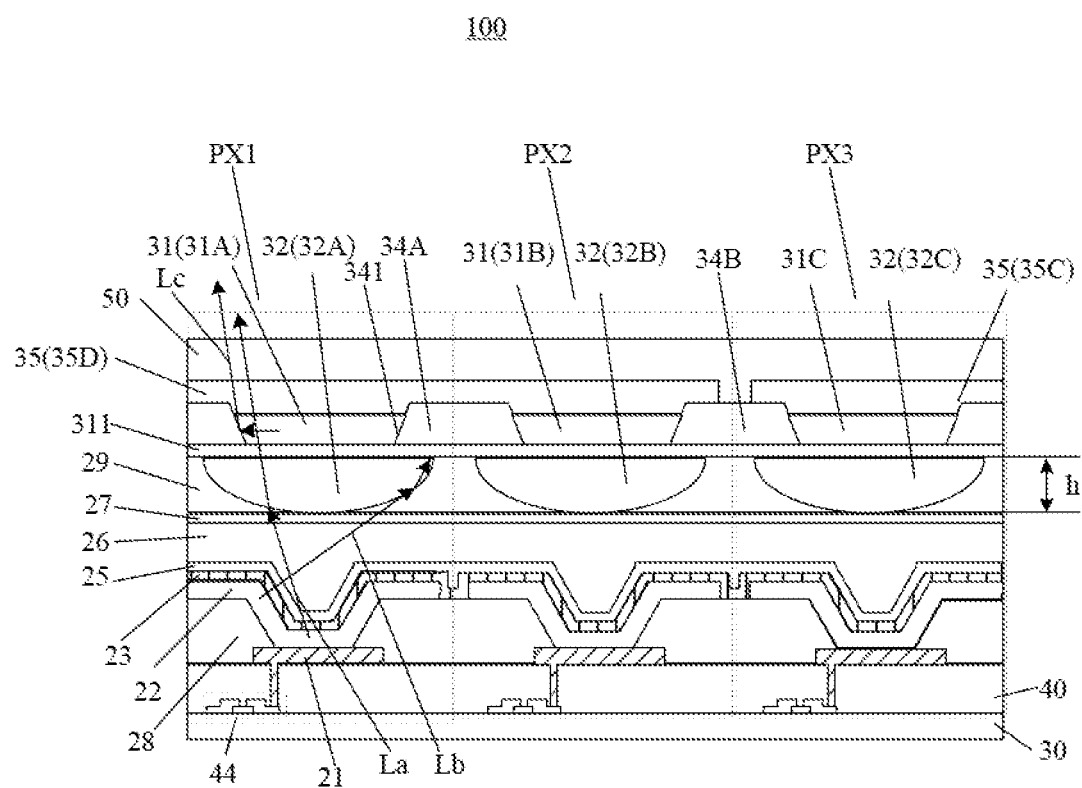
FIG. 1 shows a schematic cross-sectional view of a display panel according to some embodiments of the present disclosure.

In order to make the objectives, technical solutions and advantages of the present disclosure more apparent, the embodiments of the present disclosure will be described below with reference to the drawings. It should be understood that the following descriptions of the embodiments are intended to explain and illustrate a general concept of the present disclosure, and should not be construed as limiting the present disclosure. In the description and the drawings, the same or similar reference numerals indicate the same or similar components or members. For clarity, the drawings are not necessarily drawn in proportions, and some known components and structures may be omitted in the drawings.

Unless otherwise defined, technical terms or scientific terms used in the present disclosure shall be of the general meanings understood by the ordinary skilled in the art. The words "first", "second", and the like used in the present disclosure do not indicate any order, quantity or importance, but are used to distinguish different components. The wording "a", "an" or "one" does not exclude a plurality. The word such as "including", "comprising" or the like indicate that the element or item preceding the word contains elements, items or their equivalents listed after the word, but do not exclude other elements or items. The word such as "connected," "coupled," or the like is not limited to a physical or mechanical connection, but may include an electrical connection, whether direct or indirect. The word "upper", "lower", "left", "right", "top", "bottom" or the like is only used to indicate a relative positional relationship, and when an absolute position of the object described is changed, the relative positional relationship may also be correspondingly changed. When an element such as a layer, a film, a region or a base substrate is referred to be located "above" or "below" another element, the element may be "directly" located "above" or "below" the another element, or there may be an intermediate element.

In a color display panel, an organic light emitting element that outputs a plurality of different colors may be used, or an organic light emitting element that outputs a single color may be used and a color conversion structure is provided to obtain an output light having a plurality of colors. In the latter solution, a dual-substrate structure may be used, in which a laminated structure of the organic light emitting element is manufactured on one glass substrate, and the color conversion structure is manufactured on the other glass substrate, and then the two substrates are assembled together with a filler filled therebetween.

Figure 10:
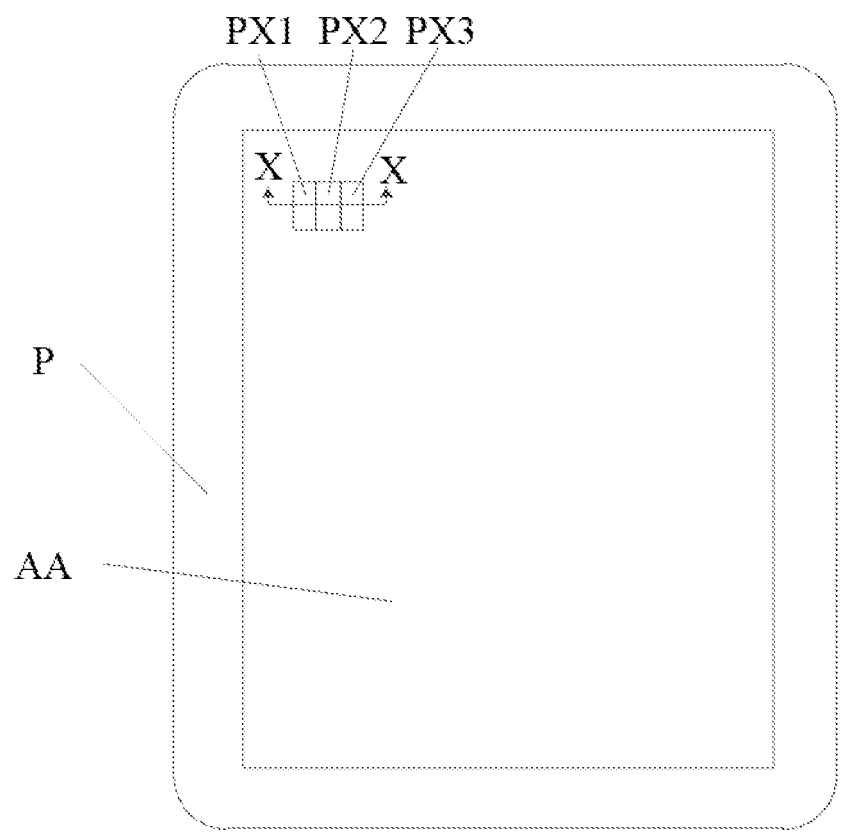
FIG. 10 shows a schematic plan view of a display panel according to some embodiments of the present disclosure.

The embodiments of the present disclosure provide a display panel 100. The display panel 100 may include a display region AA and a peripheral region P. A plurality of sub-pixels may be arranged in the display region. FIG. 10 schematically shows three adjacent sub-pixels, including a first sub-pixel PX1, a second sub-pixel PX2 and a third sub-pixel PX3. As an example, the first sub-pixel PX1, the second sub-pixel PX2 and the third sub-pixel PX3 may respectively emit lights having different colors so as to achieve a color display. For example, the first sub-pixel PX1 may emit red light, the second sub-pixel PX2 may emit green light, and the third sub-pixel PX3 may emit blue light.

FIG. 1 shows a specific film layer structure of the display panel 100 (especially the above-mentioned three sub-pixels in the display panel 100). FIG. 1 may be generally viewed as a cross-sectional view taken along line X-X in FIG. 10. The display panel 100 may include a base substrate 30, a first electrode layer 21, a luminescent material layer 22, a second electrode layer 23, a light wavelength conversion layer 31 and an elastic lens layer 32. The first electrode layer 21 may be arranged on the base substrate 30. Here, the first electrode layer 21 being arranged on the base substrate 30 does not mean that the first electrode layer 21 is necessarily arranged directly on the base substrate 30. For example, an insulating layer 40 may be provided between the first electrode layer 21 and the base substrate 30. The luminescent material layer 22 is located on a side of the first electrode layer 21 away from the base substrate 30, and the second electrode layer 23 is located on a side of the luminescent material layer 22 away from the base substrate 30. The luminescent material layer 22 is sandwiched by the first electrode layer 21 and the second electrode layer 23, and may emit an excitation light under a control of a voltage of the first electrode layer 21 and the second electrode layer 23. Here, the luminescent material layer 22, the first electrode layer 21 and the second electrode layer 23 constitute an organic light emitting element. The light wavelength conversion layer 31 is located on a side of the second electrode layer 23 away from the base substrate 30, and is used to convert the excitation light emitted from the luminescent material layer 22 into a light having a predetermined color. For example, the excitation light is blue light, and the light wavelength conversion layer 31 may convert the blue light into other colors, such as red light or green light, so as to achieve the color display. The elastic lens layer 32 is located on the side of the second electrode layer 23 away from the base substrate 30 and on a side of the light wavelength conversion layer 31 facing the base substrate 30. The elastic lens layer 32 is configured to converge the excitation light emitted from the luminescent material layer.

The elastic lens layer 32 may be made of a material with an elastic restoring force (e.g., some photoresist materials such as a positive photoresist or a negative photoresist). In the embodiment of FIG. 1, a dual-substrate structure is adopted. That is, the organic light emitting structure (for example, including the first electrode layer 21, the luminescent material layer 22 and the second electrode layer 23, etc.) may be arranged on the above-mentioned base substrate 30, and the light wavelength conversion layer 31 may be arranged on the other substrate (which may be referred to as a color filter cover plate 50), and then the two substrates are aligned and assembled together to form the display panel 100. In the related art, a thick filler (of at least 10 microns or more) is filled between the light wavelength conversion layer 31 and the organic light emitting structure, the filler may be used to support the color filter cover plate 50 and prevent the color filter cover plate 50 from over pressing the organic light emitting structure and thus affecting an operation of the organic light emitting structure. However, due to the large thickness of the filler, light emitted from the organic light emitting structure in a certain sub-pixel may enter the light wavelength conversion layer in an adjacent sub-pixel, which may cause a problem of cross color. However, if the thickness of the existing filler is reduced, a problem of uneven thickness is likely to occur, causing a defect in the display panel such as mura and the like.

In the embodiment of the present disclosure, the elastic lens layer 32 instead of the filler is arranged between the light wavelength conversion layer 31 and the organic light emitting structure. On one hand, the elastic lens layer may support the color filter cover plate 50, and on the other hand, the elastic lens layer may converge light emitted from the organic light emitting structure so as to reduce a mutual interference between light of adjacent sub-pixels. In addition, a thickness of the elastic lens layer 32 may be adjusted according to actual needs. For example, the thickness may be set between 2 microns and 9 microns, such that a thickness of the display panel may be reduced compared with the filler in the related art.

Figure 9:
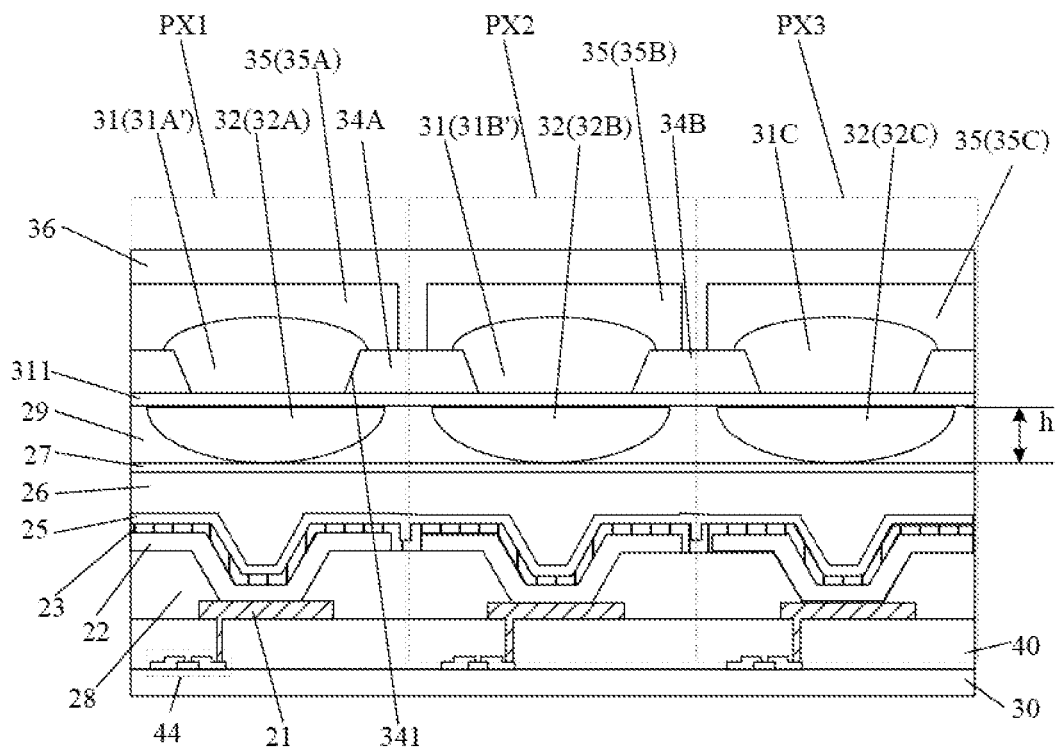
FIG. 9 shows a schematic cross-sectional view of a display panel according to still other embodiments of the present disclosure.

In some embodiments, the display panel 100 may further include an encapsulation structure, which may be arranged on the side of the second electrode layer 23 away from the base substrate 30. The encapsulation structure may be, for example, a thin film encapsulation (TFE) located between the elastic lens layer and the second electrode layer. The thin film encapsulation may include a first inorganic encapsulation layer 25, an organic encapsulation layer 26 and a second inorganic encapsulation layer 27 stacked in sequence. The thin film encapsulation may be used to prevent a functional film layer on the array substrate from being corroded and polluted by an environment. In some embodiments, a gas or a flexible medium 29 is filled around the elastic lens layer 32 between the thin film encapsulation and the light wavelength conversion layer. During operation, the elastic lens layer 32 may be deformed due to a weight carried. At this time, the gas (such as air, nitrogen, helium, etc.) or the flexible medium 29 around the elastic lens layer 32 may allow such deformation of the elastic lens layer 32. As an example, the flexible medium 29 may be made of a material matching an elastic property of the elastic lens layer 32, such as polyimide, polyamide, polyurethane, etc. The flexible medium 29 may also be deformed when the elastic lens layer 32 is deformed. For example, the flexible medium 29 may also provide an elastic restoring force of 200 MPa to 600 MPa. In order to better achieve an optical converging effect of the elastic lens layer 32, for example, a refractive index of the gas or the flexible medium 29 is less than a refractive index of the elastic lens layer 32. Compared with a common non-elastic lens layer, the elastic lens layer 32 may provide a greater support for the film layer structure (such as the color filter cover plate, etc.) carried by the elastic lens layer by means of the elastic restoring force, which is helpful to reduce a thickness of the film layer. By providing the flexible medium 29 around the flexible lens layer 32, on one hand, it may assist the elastic lens layer 32 to provide an elastic support, and on the other hand, it may facilitate a manufacturing process of the elastic lens layer 32 (details may refer to the following descriptions of the embodiment as shown in FIG. 9).

Figure 2:
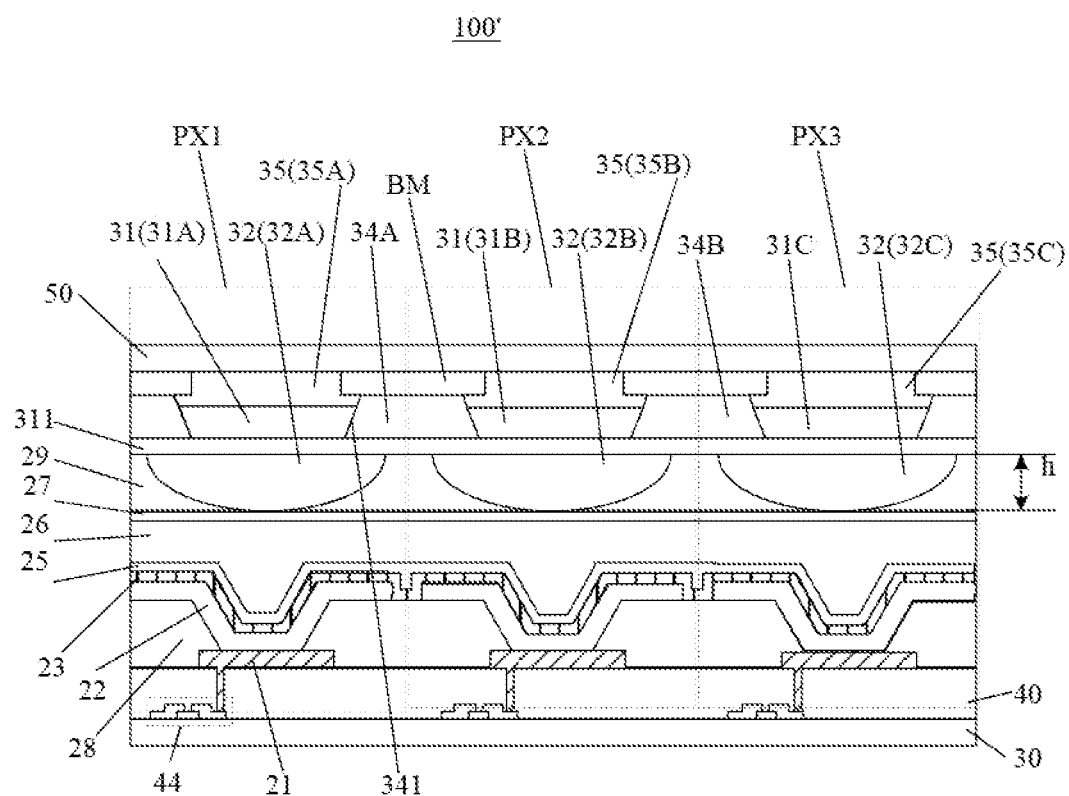
FIG. 2 shows a schematic cross-sectional view of a display panel according to some other embodiments of the present disclosure.

In some embodiments, as shown in FIG. 1 and FIG. 2, a protective layer 311 may be further provided between the elastic lens layer 32 and the light wavelength conversion layer. The protective layer 311 may be made of, for example, silicon nitride (SiN), and may be deposited over an entire surface. For example, the protective layer 311 may have a thickness of 6000 angstroms or more. A height h of the elastic lens layer 32 in a direction perpendicular to the base substrate 30 is equal to a distance from a surface of the protective layer 311 on a side facing the base substrate 30 to a surface of the thin film encapsulation on a side away from the base substrate 30 in the direction perpendicular to the base substrate. That is, upper and lower sides of the elastic lens layer 32 abut against the surface of the protective layer 311 and the surface of the thin film encapsulation, respectively. It should be noted that, in some embodiments, the protective layer 311 may not be provided, and the elastic lens layer may be in direct contact with the light wavelength conversion layer.

In some embodiments, as shown in FIG. 1, the light wavelength conversion layer 31 in the display panel 100 may include a first color light wavelength conversion layer 31A and a second color light wavelength conversion layer 31B. Correspondingly, the elastic lens layer 32 may include a first converging lens 32A and a second converging lens 32B. An orthographic projection of the first converging lens 32A on the base substrate 30 at least partially overlaps with an orthographic projection of the first color light wavelength conversion layer 31A on the base substrate 30, and an orthographic projection of the second converging lens 32B on the base substrate 30 at least partially overlaps with an orthographic projection of the second color light wavelength conversion layer 31B on the base substrate 30. The first color light wavelength conversion layer 31A and the first converging lens 32A are located in the first sub-pixel PX1, and the second color light wavelength conversion layer 31B and the second converging lens 32B are located in the second sub-pixel PX2. As an example, the orthographic projection of the first converging lens 32A on the base substrate 30 may completely cover the orthographic projection of the first color light wavelength conversion layer 31A on the base substrate 30, such that the first converging lens 32A may better converge the light emitted from the luminescent material layer 22 into the first color light wavelength conversion layer 31A. As shown in FIG. 1, excitation lights La and Lb emitted from the luminescent material layer 22 may be deflected toward the first color light wavelength conversion layer 31A through a convergence of the first converging lens 32A. In this case, even the excitation light Lb with a larger divergence angle emitted from the luminescent material layer 22 may not be emitted to the adjacent second color light wavelength conversion layer 31B due to the convergence of the first converging lens 32A, and may be absorbed by a spacer 34A. That is, when the orthographic projection of the first converging lens 32A on the base substrate 30 is larger (for example, in a case of completely covering the orthographic projection of the first color light wavelength conversion layer 31A on the base substrate 30), an optical interference between adjacent light wavelength conversion layers may be reduced. Likewise, in some embodiments, the orthographic projection of the second converging lens 32B on the base substrate 30 may also completely cover the orthographic projection of the second color light wavelength conversion layer 31B on the base substrate 30.

In some embodiments, the adjacent first color light wavelength conversion layer 31A and second color light wavelength conversion layer 31B are spaced apart by the spacer 34A in a direction parallel to the base substrate 30. The spacer 34A may prevent a mutual interference between the light from light wavelength conversion layers of different colors, and may further improve a contrast ratio of the display panel. In the embodiments of the present disclosure, the spacer 34A may absorb and/or reflect the light.

As an example, as shown in FIG. 1, a cross section of the spacer 34A has a trapezoidal shape. A bottom edge (a lower bottom edge in FIG. 1) of the trapezoid away from the first color light wavelength conversion layer 31A and the second color light wavelength conversion layer 31B is longer than a bottom edge (an upper bottom edge in FIG. 1) of the trapezoid close to the first color light wavelength conversion layer 31A and the second color light wavelength conversion layer 31B. In other words, an inner angle formed between a side slope surface 341 of the spacer 34A facing the first color light wavelength conversion layer 31A or the second color light wavelength conversion layer 31B and a surface (a lower surface of the spacer 34A in FIG. 1) of the spacer 34A on a side facing the base substrate 30 is less than 90 degrees. This means that the side slope surface 341 of the spacer 34A faces away from the first converging lens 32A or the second converging lens 32B. After the light emitted from the luminescent material layer 22 is incident on the first color light wavelength conversion layer 31A or the second color light wavelength conversion layer 31B, the light may be interacted with a structure (e.g., quantum dots, etc.) in the first color light wavelength conversion layer 31A or the second color light wavelength conversion layer 31B. During the interaction, a direction of the light may be changed, and the light may be irradiated on the side slope surface 341 of the spacer 34A. Since the inner angle formed between the side slope surface 341 and the surface of the spacer 34A on the side facing the base substrate 30 (the lower surface of the spacer 34A in FIG. 1) is less than 90 degrees, at least part of the light may be reflected in a direction away from the first converging lens 32A or the second converging lens 32B (referring to light Lc in FIG. 1) when the light is irradiated on the side slope surface 341, such that an amount of the light output may be increased, and a problem such as interference caused by the side slope surface 341 reflecting the light toward the luminescent material layer 22 may be avoided.

In some embodiments, an area of an orthographic projection of the surface of the spacer 34A on the side facing the base substrate 30 on the base substrate 30 is greater than an area of an orthographic projection of the surface of the spacer 34A on the side away from the base substrate 30 on the base substrate 30, which may help more light to be emitted from the first color light wavelength conversion layer 31A or the second color light wavelength conversion layer 31B.

Figure 3:
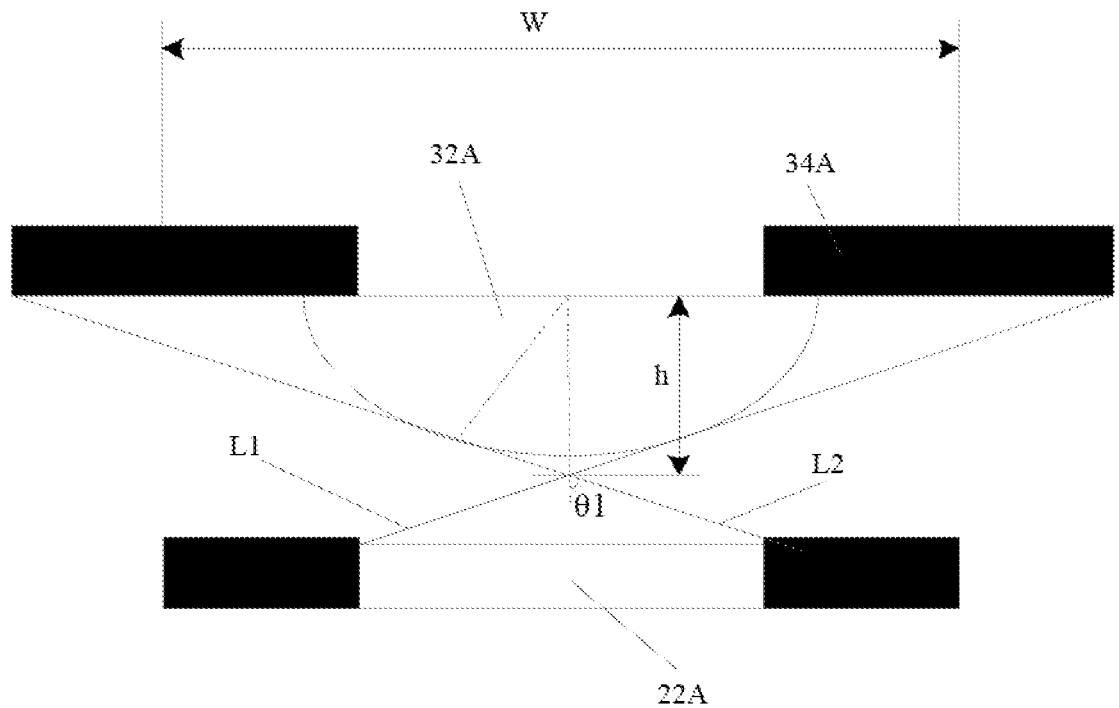
FIG. 3 shows a schematic diagram of a converging lens in an elastic lens layer.

In the following, the first converging lens 32A is used as an example to describe a height of the lens in the elastic lens layer 32. FIG. 3 schematically shows a position and size relationship of the first converging lens 32A with surrounding structures. The greater a height h of the first converging lens 32A in the direction perpendicular to the base substrate 30, the greater a distance between the luminescent material layer 22 and the first color light wavelength conversion layer 31A, which may reduce a utilization rate of the light. Left and right boundaries of the luminescent material layer 22 corresponding to the first converging lens 32A are schematically shown in FIG. 3. Assuming that light emitted from left and right boundaries of an effective light emitting region 22A of the luminescent material layer 22 is tangent to the first converging lens 32A (it should be understood that only a part of the luminescent material layer 22 where the voltage is applied may emit light effectively, and it may generally be considered that a part of the luminescent material layer 22 in an opening region of a pixel defining layer 28 is the effective light emitting region 22A of the luminescent material layer 22. FIG. 3 schematically shows the left and right boundaries of the effective light emitting region 22A (i.e., a border between the effective light emitting region 22A and a black block on the left side of the effective light emitting region 22A, and a border between the effective light emitting region 22A and a black block on the right side of the effective light emitting region 22A)), it may be determined that the height h of the first converging lens 32A in the direction perpendicular to the base substrate 30 satisfies formula (1):

$$h \leq \frac{W}{2 \times \tan\theta 1}, \quad \text{formula (1)}$$

where as shown in FIG. 3, W represents a sum of a width of the first color light wavelength conversion layer 31A and a width of the spacers 34A on two sides adjacent to the first color light wavelength conversion layer 31A. θ1 represents a predetermined divergence angle of excitation light emitted from the effective light emitting region 22A. Assuming that in the present disclosure, the divergence angle θ1 is defined as an angle between an envelope of a cross section of an excitation light beam in the direction perpendicular to the base substrate 30 and the direction perpendicular to the base substrate 30. When the excitation light beam has such divergence angle θ1, the excitation light beam just does not irradiate onto other light wavelength conversion layers adjacent to the first color light wavelength conversion layer 31A. When the height h of the first converging lens 32A in the direction perpendicular to the base substrate 30 does not satisfy the above formula (1) (that is, when the height h is greater than the part on the right side of the inequality sign in the formula (1)), the first converging lens 32A may cause an undesired deflection of the excitation light beam, such that a part of the light is irradiated onto other light wavelength conversion layers adjacent to the first color light wavelength conversion layer 31A, thereby causing a crosstalk.

On the other hand, a too small height h of the first converging lens 32A in the direction perpendicular to the base substrate 30 may cause an excessively large radius of curvature of the first converging lens 32A. With the excessively large radius of curvature of the first converging lens 32A, the first converging lens 32A may overlap with other adjacent converging lens (such as the second converging lens 32B) if sizes of the sub-pixels are constant. Thus, the excessively large radius of curvature of the first converging lens 32A may cause an unnecessary increase in the size of the sub-pixel and reduce a resolution. In addition, a too small height h of the first converging lens 32A in the direction perpendicular to the base substrate 30 is also unfavorable to elastically support the structure pressed on the elastic lens layer 32 (especially when a heavy substrate or cover plate is provided on the elastic lens layer 32). As an example, the height h of the first converging lens 32A in the direction perpendicular to the base substrate 30 may be 2 microns to 9 microns.

Although the first converging lens 32A is illustrated by way of example to describe the converging lens structure in the elastic lens layer 32, it should be understood that other converging lens structures in the elastic lens layer 32 (for example, the second converging lens 32B, etc.) may be similar, and the details will not be repeated here.

In the embodiment of the present disclosure, the converging lens structure in the elastic lens layer 32 is desired to have a large refractive index so as to converge the excitation light emitted from the luminescent material layer 22. As an example, the converging lens structure in the elastic lens layer 32 may have an elastic restoring force of 200 MPa to 600 MPa, e.g., about 400 MPa. For example, the converging lens structure in the elastic lens layer 32 may be made of a photoresist material (such as some positive resists or negative resists), and may also be made of materials such as polyimide, polyamide, polyurethane, resin, etc.

In some embodiments, as shown in FIG. 2, a display panel 100' may further include a black matrix layer BM located on a side of the spacer 34A away from the base substrate 30. An orthographic projection of the black matrix layer BM on the base substrate 30 at least partially overlaps the orthographic projection of the spacer 34A on the base substrate 30. On one hand, the black matrix layer BM may be used to separate adjacent sub-pixels, and on the other hand, the black matrix layer BM may be used as an alignment reference in a process of manufacturing a film structure of the display panel. For example, when a dual-substrate structure is adopted for the display panel, the spacer 34A, the light wavelength conversion layer and the elastic lens layer 32 are all arranged on the color filter substrate 50, and the black matrix layer BM may be formed on the color filter substrate 50 before these structures are formed, such that the black matrix layer BM may be used as the alignment reference for forming the spacer 34A, the light wavelength conversion layer, the elastic lens layer 32 and other structures.

In some embodiments, the excitation light emitted from the luminescent material layer 22 may have a third color. The first color light wavelength conversion layer 31A may convert the excitation light of the third color into light of the first color, and the second color light wavelength conversion layer 31B may convert the excitation light of the third color into light of the second color. For example, the luminescent material layer 22 may emit blue light, the light of the first color is red light, and the light of the second color is green light. For a display panel with sub-pixels of three colors (such as red, green and blue), the light of the third color may be emitted without being converted into other colors since the light of the third color itself may be used for display. In the example shown in FIG. 1, the display panel may further include a third color light transmission layer 31C located on the side of the second electrode layer 23 away from the base substrate 30 and used for transmitting the excitation light. Correspondingly, the elastic lens layer 32 may further include a third converging lens 32C. An orthographic projection of the third converging lens 32C on the base substrate 30 at least partially overlaps with an orthographic projection of the third color light transmission layer 31C on the base substrate 30. The third converging lens 32C may be used to converge and guide the excitation light of the third color emitted from the luminescent material layer 22 to the third color light transmission layer 31C. As an example, the orthographic projection of the third converging lens 32C on the base substrate 30 may completely cover the orthographic projection of the third color light transmission layer 31C on the base substrate 30, such that the excitation light of the third color may be converged and guided as much as possible into the third color light transmission layer 31C by the third converging lens 32C. The third color light transmission layer 31C may be arranged side by side with the first color light wavelength conversion layer 31A and the second color light wavelength conversion layer 31B. Adjacent two of the first color light wavelength conversion layer 31A, the second color light wavelength conversion layer 31B and the third color light transmission layer 31C may be spaced apart by spacers 34A and 34B.

In some embodiments, at least one of the first color light wavelength conversion layer 31A, the second color light wavelength conversion layer 31B and the third color light transmission layer 31C contains scattering particles used to scatter the incident excitation light. For example, the first color light wavelength conversion layer 31A, the second color light wavelength conversion layer 31B and the third color light transmission layer 31C may all contain such scattering particles. With such scattering particles, an intensity distribution of the light emitted from the first color light wavelength conversion layer 31A, the second color light wavelength conversion layer 31B and the third color light transmission layer 31C may be more uniform. In particular, in a case that the third color light transmission layer 31C does not contain such scattering particles, the light intensity of the exit light may be relatively concentrated in a certain region (for example, within a viewing angle of plus or minus 30 degrees), while the intensity of the exit light beyond this region may be decreased significantly, which may result in different intensities of a displayed image viewed by observers in different regions. In a case that the third color light transmission layer 31C contains such scattering particles, the light intensity of the exit light may be uniform in a larger range (for example, within a viewing angle of plus or minus 60 degrees or a viewing angle of plus or minus 80 degrees). In addition, the scattering particles arranged in the first color light wavelength conversion layer 31A and the second color light wavelength conversion layer 31B may also increase an efficiency of light wavelength conversion by scattering (for example, an the interaction between the incident light and quantum dots when the first color light wavelength conversion layer 31A is a quantum dot layer). As an example, a size of the scattering particle may be in a range of 100 nm to 600 nm. For example, the scattering particles may be made of a material such as titanium dioxide.

In some embodiments, the display panel may further include a filter layer 35 located on a side of the at least one light wavelength conversion layer 31 away from the base substrate 30. The filter layer 35 is used to filter the exit light from the first color light wavelength conversion layer 31A and the second color light wavelength conversion layer 31B. The filter layer 35 may be used to eliminate the excitation light emitted from the luminescent material layer 22 to prevent the exit light from interfering the first color light wavelength conversion layer 31A and the second color light wavelength conversion layer 31B. In some embodiments, the filter layer may include a filter film formed from a plurality of layers of optical interference films (or referred as thin film filters).

Figure 5:
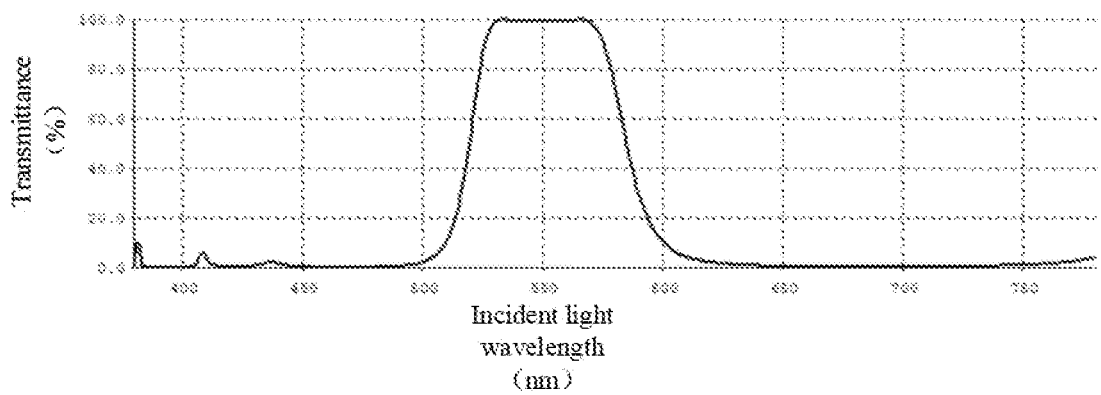
FIG. 5 shows a schematic diagram of a filtering property of a thin film filter in a display panel according to some embodiments of the present disclosure.

FIG. 5, FIG. 6, FIG. 7 and FIG. 8 show relationships between transmittances and wavelengths of four different filter films, respectively. FIG. 5 shows a filter film that may be used to filter the light emitted from the second color light wavelength conversion layer 31B. This filter film may transmit the green light (with a pass band wavelength range of about 510 nm to 590 nm) and eliminate light of other wavelengths. This filter film may be composed of, for example, a plurality of alternating film layers of titanium dioxide (TiO2) and silicon dioxide (SiO2), and an example of which is given in Table 1 below.

TABLE 1

| Film sequence | Material | Thickness (nm) |
|---|---|---|
| 1 | TiO$_2$ | 32.50 |
| 2 | SiO$_2$ | 15.83 |
| 3 | TiO$_2$ | 41.31 |
| 4 | SiO$_2$ | 88.44 |
| 5 | TiO$_2$ | 72.08 |
| 6 | SiO$_2$ | 93.25 |
| 7 | TiO$_2$ | 18.50 |
| 8 | SiO$_2$ | 28.51 |
| 9 | TiO$_2$ | 45.14 |
| 10 | SiO$_2$ | 91.78 |
| 11 | TiO$_2$ | 41.89 |
| 12 | SiO$_2$ | 90.67 |
| 13 | TiO$_2$ | 32.47 |
| 14 | SiO$_2$ | 16.32 |
| 15 | TiO$_2$ | 45.16 |
| 16 | SiO$_2$ | 96.04 |
| 17 | TiO$_2$ | 54.37 |
| 18 | SiO$_2$ | 91.69 |
| 19 | TiO$_2$ | 28.86 |
| 20 | SiO$_2$ | 17.87 |
| 21 | TiO$_2$ | 45.91 |

In the example given in Table 1, the filter film is composed of 11 layers of titanium dioxide and 10 layers of silicon dioxide arranged alternately. A total thickness of various titanium dioxide layers is 458.19 nm, and a total thickness of various silicon dioxide layers is 630.40 nm. The incident light may be transmitted and reflected between adjacent titanium dioxide layer and silicon dioxide layer, and a plurality of formed beams of transmitted light and reflected light may interfere to form a desired spatial light intensity distribution.

Figure 6:
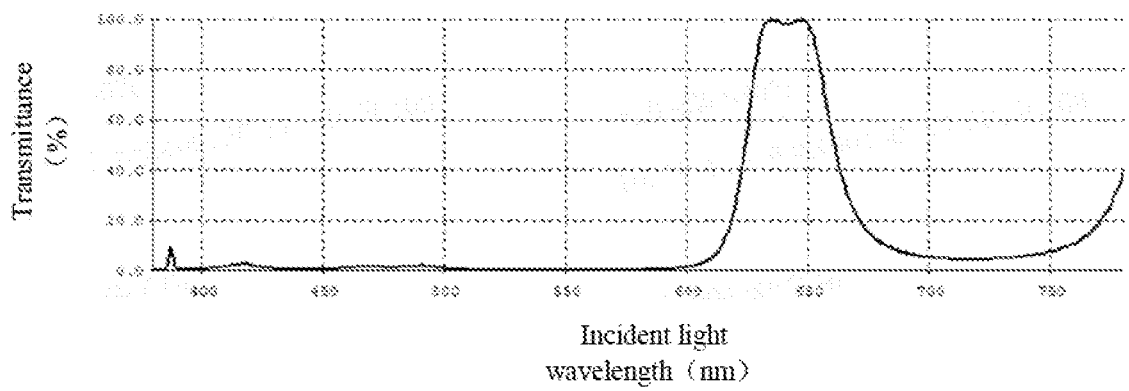
FIG. 6 shows a schematic diagram of a filtering property of another thin film filter in a display panel according to some embodiments of the present disclosure.

FIG. 6 shows a filter film that may be used to filter the light emitted from the first color light wavelength conversion layer 31A. This filter film may transmit the red light (with a pass band wavelength range of about 620 nm to 670 nm) and eliminate light of other wavelengths. This filter film may also be composed of, for example, a plurality of alternating film layers of titanium dioxide (TiO2) and silicon dioxide (SiO2), and an example is given in Table 2 below.

TABLE 2

| Film sequence | Material | Thickness (nm) |
|---|---|---|
| 1 | $TiO_2$ | 43.44 |
| 2 | $SiO_2$ | 65.99 |
| 3 | $TiO_2$ | 5.10 |
| 4 | $SiO_2$ | 75.08 |
| 5 | TiO2 | 39.78 |
| 6 | $SiO_2$ | 62.69 |
| 7 | $TiO_2$ | 23.50 |
| 8 | $SiO_2$ | 65.59 |
| 9 | $TiO_2$ | 85.76 |
| 10 | $SiO_2$ | 83.59 |
| 11 | $TiO_2$ | 48.84 |
| 12 | $SiO_2$ | 87.70 |
| 13 | $TiO_2$ | 40.29 |
| 14 | $SiO_2$ | 81.93 |
| 15 | $TiO_2$ | 61.48 |
| 16 | $SiO_2$ | 48.26 |
| 17 | $TiO_2$ | 30.62 |
| 18 | $SiO_2$ | 83.81 |
| 19 | $TiO_2$ | 60.80 |

In the example given in Table 2, the filter film is composed of 10 layers of titanium dioxide and 9 layers of silicon dioxide arranged alternately. A total thickness of various titanium dioxide layers is 439.59 nm, and a total thickness of various silicon dioxide layers is 654.65 nm. The incident light may be transmitted and reflected between adjacent titanium dioxide layer and silicon dioxide layer, and a plurality of formed beams of transmitted light and reflected light may interfere to form a desired spatial light intensity distribution. The spatial light intensity distribution depends on an arrangement of each film layer and a thickness of each layer. The example given in Table 2 has a different filtering effect because the numbers and thicknesses of each film layer are different from those of the example given in Table 1.

Figure 7:
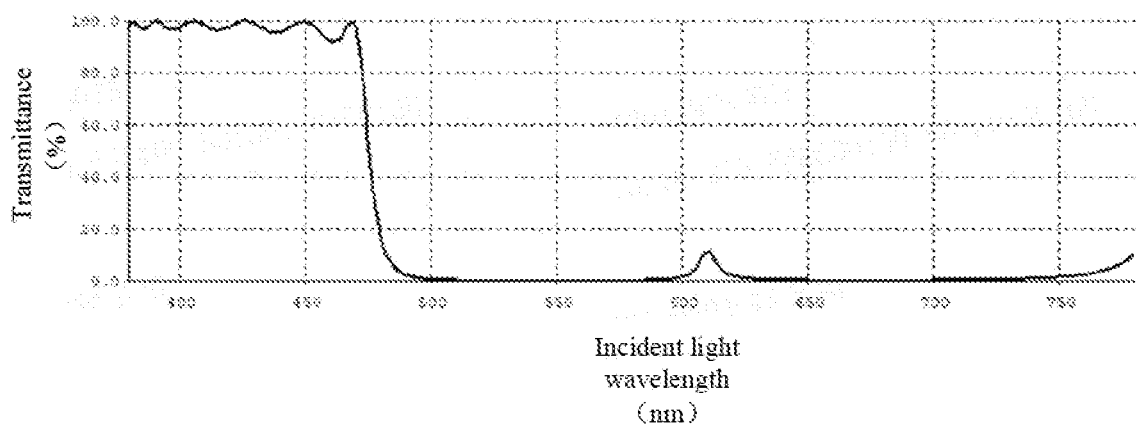
FIG. 7 shows a schematic diagram of a filtering property of still another thin film filter in a display panel according to some embodiments of the present disclosure.

FIG. 7 shows a filter film that may be used to filter the light emitted from the third color light transmission layer 31C. This filter film is a short pass filter film, which may transmit the blue light (with a pass band wavelength range of about less than 480 nm) and eliminate light of other wavelengths. This filter film may also be composed of, for example, a plurality of alternating film layers of titanium dioxide (TiO2) and silicon dioxide (SiO2), and an example is given in Table 3 below.

TABLE 3

| Film sequence | Material | Thickness (nm) |
|---|---|---|
| 1 | $TiO_2$ | 57.79 |
| 2 | $SiO_2$ | 100.22 |
| 3 | $TiO_2$ | 53.15 |
| 4 | $SiO_2$ | 123.26 |
| 5 | $TiO_2$ | 16.96 |

TABLE 3-continued

| Film sequence | Material | Thickness (nm) |
|---|---|---|
| 6 | $SiO_2$ | 22.51 |
| 7 | $TiO_2$ | 69.99 |
| 8 | $SiO_2$ | 104.25 |
| 9 | $TiO_2$ | 49.18 |
| 10 | $SiO_2$ | 102.70 |
| 11 | $TiO_2$ | 47.36 |
| 12 | $SiO_2$ | 102.30 |
| 13 | $TiO_2$ | 49.48 |
| 14 | $SiO_2$ | 100.43 |
| 15 | $TiO_2$ | 50.76 |
| 16 | $SiO_2$ | 19.17 |
| 17 | $TiO_2$ | 3.55 |

In the example given in Table 3, the filter film is composed of 9 layers of titanium dioxide and 8 layers of silicon dioxide arranged alternately. A total thickness of various titanium dioxide layers is 398.22 nm, and a total thickness of various silicon dioxide layers is 674.84 nm. The incident light may also be transmitted and reflected between adjacent titanium dioxide layer and silicon dioxide layer, and a plurality of formed beams of transmitted light and reflected light may interfere to form a desired spatial light intensity distribution. The spatial light intensity distribution depends on an arrangement of each film layer and a thickness of each layer. The example given in Table 3 has a different filtering effect because the numbers and thicknesses of each film layer are different from those of the examples given in Table 1 and Table 2.

Figure 8:
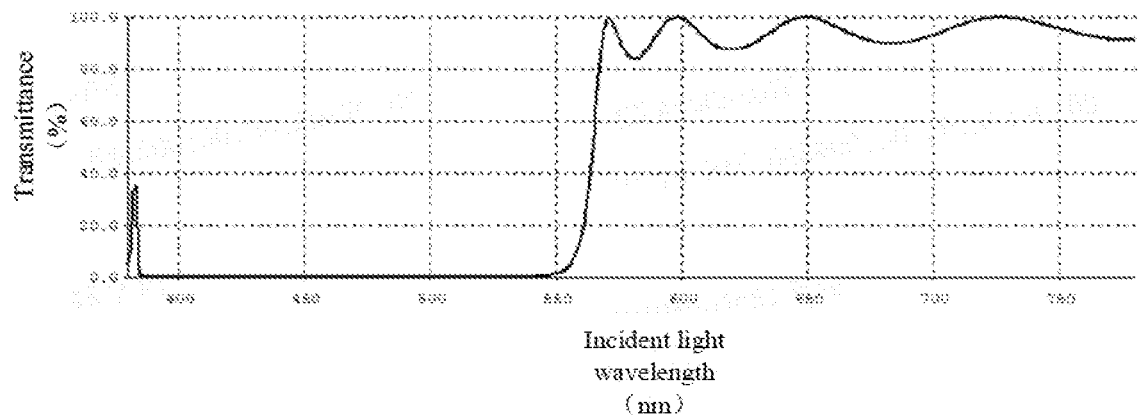
FIG. 8 shows a schematic diagram of a filtering property of yet another thin film filter in a display panel according to some embodiments of the present disclosure.

FIG. 8 shows a filter film that may be used to filter the light emitted from the first color light wavelength conversion layer 31A and the second color light wavelength conversion layer 31B. This filter film is a long pass filter film, which may transmit the red light and a considerable part of the green light (with a pass band wavelength range of about greater than 560 nm) and eliminate light of other wavelengths. The filter film may also be composed of, for example, a plurality of alternating film layers of titanium dioxide (TiO2) and silicon dioxide (SiO2), and an example is given in Table 4 below.

TABLE 4

| Film sequence | Material | Thickness (nm) |
|---|---|---|
| 1 | $SiO_2$ | 70.85 |
| 2 | $TiO_2$ | 32.14 |
| 3 | $SiO_2$ | 56.69 |
| 4 | $TiO_2$ | 44.00 |
| 5 | $SiO_2$ | 64.10 |
| 6 | $TiO_2$ | 39.47 |
| 7 | $SiO_2$ | 67.71 |
| 8 | $TiO_2$ | 42.31 |
| 9 | $SiO_2$ | 64.54 |
| 10 | $TiO_2$ | 41.77 |
| 11 | $SiO_2$ | 68.82 |
| 12 | $TiO_2$ | 40.83 |
| 13 | $SiO_2$ | 64.19 |
| 14 | $TiO_2$ | 43.35 |
| 15 | $SiO_2$ | 68.92 |
| 16 | $TiO_2$ | 37.93 |
| 17 | $SiO_2$ | 63.14 |
| 18 | $TiO_2$ | 46.80 |
| 19 | $SiO_2$ | 68.53 |
| 20 | $TiO_2$ | 21.98 |

In the example given in Table 4, the filter film is composed of 10 layers of titanium dioxide and 10 layers of silicon dioxide arranged alternately. A total thickness of various titanium dioxide layers is 390.58 nm, and a total thickness of various silicon dioxide layers is 657.49 nm. The incident light may also be transmitted and reflected between adjacent titanium dioxide layer and silicon dioxide layer, and a plurality of formed beams of transmitted light and reflected light may interfere to form a desired spatial light intensity distribution. The spatial light intensity distribution depends on an arrangement of each film layer and a thickness of each layer. The example given in Table 4 has a different filtering effect because the numbers and thicknesses of each film layer are different from those of the examples given in Table 1, Table 2 and Table 3.

Some examples of the filter layer are given above. In the above examples, the filter layer is composed of a plurality of layers of optical interference films. As shown in FIG. 5 to FIG. 8, the filter layer has a good signal-to-noise ratio, and an attenuation of a stop band relative to the pass band is very significant. However, in the existing display panel, the filter layer is generally made of a photoresist, and the filtering is achieved by utilizing a difference in an absorption effect of the photoresist on lights of different wavelengths. In some embodiments of the present disclosure, the filter layer composed of the plurality of layers of optical interference films may achieve the filtering by using the interference and reflection effects of the optical interference film on lights of different wavelengths (for example, the light that is not expected to pass through the filter film may be reflected back), and have a better filtering effect compared with a filter layer made of photoresist. The specific implementation of the filter film is not limited to the above embodiments. In practice, parameters such as the material, the number of layers, the thickness, etc., of each optical interference film may be set as required to achieve the desired filtering effect. Certainly, in other embodiments of the present disclosure, structures other than the above-mentioned plurality of layers of optical interference film may also be used to manufacture the filter film.

In some embodiments, the filter layer includes a long pass filter film 35D (for example, a filtering property of the long pass filter film is shown in FIG. 8). Such long pass filter film may be used to filter the light emitted from the first color light wavelength conversion layer 31A and the second color light wavelength conversion layer 31B. As an example, as shown in FIG. 1, an orthographic projection of the long pass filter film on the base substrate 30 may cover the orthographic projection of the first color light wavelength conversion layer 31A on the base substrate 30 and the orthographic projection of the second color light wavelength conversion layer 31B on the base substrate 30. A pass band wavelength range of the long pass filter film may cover a desired exit light wavelength range of the first color light wavelength conversion layer 31A and a desired exit light wavelength range of the second color light wavelength conversion layer 31B, and a stop band wavelength range of the long pass filter film covers a wavelength range of the excitation light emitted from the luminescent material layer 22. It should be noted that, in the embodiments of the present disclosure, it is not necessary that the pass band wavelength range of the long pass filter film completely covers the desired exit light wavelength range of the first color light wavelength conversion layer 31A and the desired exit light wavelength range of the second color light wavelength conversion layer 31B, as long as the pass band wavelength range of the long pass filter film at least partially covers the desired exit light wavelength range of the first color light wavelength conversion layer 31A and at least partially covers the desired exit light wavelength range of the second color light wavelength conversion layer 31B. In this way, it may be avoided to provide different filter layers for the first color light wavelength conversion layer 31A and the second color light wavelength conversion layer 31B, respectively, such that a manufacturing process is simplified.

In some embodiments, the filter layer may include a first color filter film 35A and a second color filter film 35B (as shown in FIG. 2). An orthographic projection of the first color filter film 35A on the base substrate 30 covers the orthographic projection of the first color light wavelength conversion layer 31A on the base substrate 30, and the first color filter film 35A is configured to eliminate light of wavelengths outside the desired exit light wavelength range of the first color light wavelength conversion layer 35A. For example, when the output light of the first color light wavelength conversion layer 31A is the red light, the first color filter film 35A may be a red pass film, which may have, for example, the property shown in FIG. 6. An orthographic projection of the second color filter film 35B on the base substrate 30 covers the orthographic projection of the second color light wavelength conversion layer 31B on the base substrate 30, and the second color filter film 35B is configured to eliminate light of wavelengths outside the desired exit light wavelength range of the second color light wavelength conversion layer 31B. For example, when the output light of the second color light wavelength conversion layer 31B is the green light, the second color filter film 35B may be a green pass film, which may have, for example, the property shown in FIG. 5.

In the embodiments described above, at least one of the long pass filter film, the first color filter film and the second color filter film may have a high reflectivity for the blue light. This is beneficial to reflect the blue light back to the first color light wavelength conversion layer 31A and the second color light wavelength conversion layer 31B, thereby improving the utilization efficiency of the blue light.

In some embodiments, the display panel may further include a third color filter film 35C located on a side of the third color light transmission layer 31C away from the base substrate 30. An orthographic projection of the third color filter film 35C on the base substrate 30 covers the orthographic projection of the third color light transmission layer 31C on the base substrate 30. The third color filter film 35C is used to eliminate light of wavelengths outside the desired wavelength range of the excitation light emitted from the luminescent material layer 22. For example, when the excitation light emitted from the luminescent material layer 22 is the blue light, the third color filter film 35C may be a blue pass film, which may have, for example, the property shown in FIG. 7.

In the embodiments described above, the display panel includes the dual-substrate structure, that is, the base substrate 30 and the color filter cover plate 50 are arranged opposite to each other. As an example, the color filter cover plate 50 is located on a side of the filter layer 35 away from the base substrate 30. However, the embodiments of the present disclosure are not limited thereto. For example, the display panel may not include the color filter cover plate 50, and only include the base substrate 30, thus is a single-substrate structure. Such an embodiment is shown in FIG. 9. In this embodiment, in a display panel 100", only a protective layer 36 is provided on the side of the filter layers 35 (e.g., the first color filter film 35A, the second color filter film 35B, and the third color filter film 35C) away from the base substrate 30, without providing a cover plate made of glass or plastic, for example. A process of manufacturing the display panel by using the dual-substrate structure is different from that of the display panel by using the single-substrate structure. For the display panel with the dual-substrate structure, the structures such as the first electrode layer 21, the luminescent material layer 22 and the second electrode layer 23 (which may further include, for example, the thin film encapsulation TFE) are generally formed on the base substrate 30, and the structures such as the light wavelength conversion layer 31 and the elastic lens layer 32 (which may further include, for example, the spacer 34A and the filter layers 35) are formed on the color filter cover plate 50. Then, the base substrate 30 and the color filter substrate 50 formed with these structures are assigned and assembled together. For the display panel with the single-substrate structure, the structures such as the first electrode layer 21, the luminescent material layer 22 and the second electrode layer 23 may be formed on the base substrate 30, and then the structures such as the elastic lens layer 32 and the light wavelength conversion layer 31 may be formed on the base substrate 30. In the embodiments of FIG. 9, the flexible medium 29 is filled around the elastic lens layer 32 between the surface (an upper surface in FIG. 9) of the thin film encapsulation away from the base substrate 30 and the surface (a lower surface in FIG. 9) of the light wavelength conversion layer facing the base substrate 30. The flexible medium 29 may be deformed correspondingly when the elastic lens layer 32 is elastically deformed, so as to cooperate with the elastic lens layer 32. In this case, the flexible medium 29 may not only cooperate with the elastic lens layer 32 for an auxiliary support, but also facilitate a manufacture of the elastic lens layer 32. For example, after the thin film encapsulation (for example, including the first inorganic encapsulation layer 25, the organic encapsulation layer 26 and the second inorganic encapsulation layer 27) is formed on the base substrate 30, a layer of flexible medium 29 may be formed on the surface of the thin film encapsulation, an accommodating opening is formed in the flexible medium 29, and then the elastic lens layer 32 is formed in the accommodating opening. As an example, a thickness of the flexible medium 29 in the direction perpendicular to the base substrate 30 may be substantially equal to the height of the elastic lens layer 32 in the direction perpendicular to the base substrate 30.

In some embodiments, a surface of one or more of the at least one light wavelength conversion layer 31 in the display panel on the side away from the base substrate 30 may have a shape of a converging lens surface. This is usually because the one or more light wavelength conversion layers 31 are (partially or all) formed by printing technology rather than by evaporation. This is beneficial for simplifying the process, and is particularly beneficial for a large-sized display panel (e.g., a display panel of a television or a computer monitor, etc.). In the embodiment of FIG. 9, surfaces of a first color light wavelength conversion layer 31A', a second color light wavelength conversion layer 31B' and the third color light transmission layer 31C on the side away from the base substrate 30 all have shapes of the converging lens surface, which is beneficial to increase the exit light intensity of the first color light wavelength conversion layer 31A', the second color light wavelength conversion layer 31B' and the third color light transmission layer 31C. However, this is not necessary. For example, only a part of the surfaces of the first color light wavelength conversion layer 31A', the second color light wavelength conversion layer 31B' and the third color light transmission layer 31C in the display panel on the side away from the base substrate 30 may have the shape of the converging lens surface.

It should be noted that, in the above-described embodiments shown in FIG. 1, FIG. 2 and FIG. 9, the first converging lens 32A, the second converging lens 32B and the third converging lens 32C in the elastic lens layer 32 are arranged to have convex surfaces facing the base substrate 30 and flat surfaces away from the base substrate 30. However, this is only illustrative, and the embodiments of the present disclosure are not limited thereto. For example, if process conditions permit, the first converging lens 32A, the second converging lens 32B and the third converging lens 32C in the elastic lens layer 32 may also be arranged to have flat surfaces facing the base substrate 30 and convex surfaces away from the base substrate 30. For the dual-substrate structure, it is more advantageous to arrange the convex surface of the converging lens to face the base substrate 30 and the flat surface to face away from the base substrate 30 as shown in FIG. 1 and FIG. 2. In the process of manufacturing the display panel with the dual-substrate structure, the elastic lens layer 32 is generally formed on the color filter substrate. Therefore, by arranging the flat surface of the converging lens away from the base substrate 30 (i.e., facing the color filter substrate), the flat surface of the converging lens may be attached to other structures of the color filter substrate (such as the protective layer 311), such that the shape of the converging lens may be easily formed and the thickness occupied by the gas or the flexible medium 29 in the direction perpendicular to the base substrate is easily reduced. However, if the convex surface of the converging lens faces the color filter substrate, that is, the convex surface of the converging lens is formed on other structures of the color filter substrate (such as the protective layer 311), it may cause difficulties in the manufacturing process and make it more difficult to form the shape of the converging lens (especially for the structure in which the elastic lens layer 32 is filled with gas), and it is not conducive to reducing a total thickness of the display panel.

In some embodiments, as shown in FIG. 1, an insulating layer 40 and a driving circuit structure such as a thin film transistor 44 may be further provided between the base substrate 30 and the first electrode layer 21. A pixel defining layer 28 may be further provided between the luminescent material layer 22 and the insulating layer 40, and the pixel defining layer 28 is provided with an opening region for defining a placement position of the luminescent material layer 22. Since the content of the present disclosure is mainly related to the elastic lens layer 32 and the light wavelength conversion layer, the encapsulation structure, the insulating layer 40, the pixel defining layer 28 and the driving circuit structure are not illustrated and discussed in detail.

A method of manufacturing a display panel according to the embodiments of the present disclosure will be introduced below.

Figure 11:
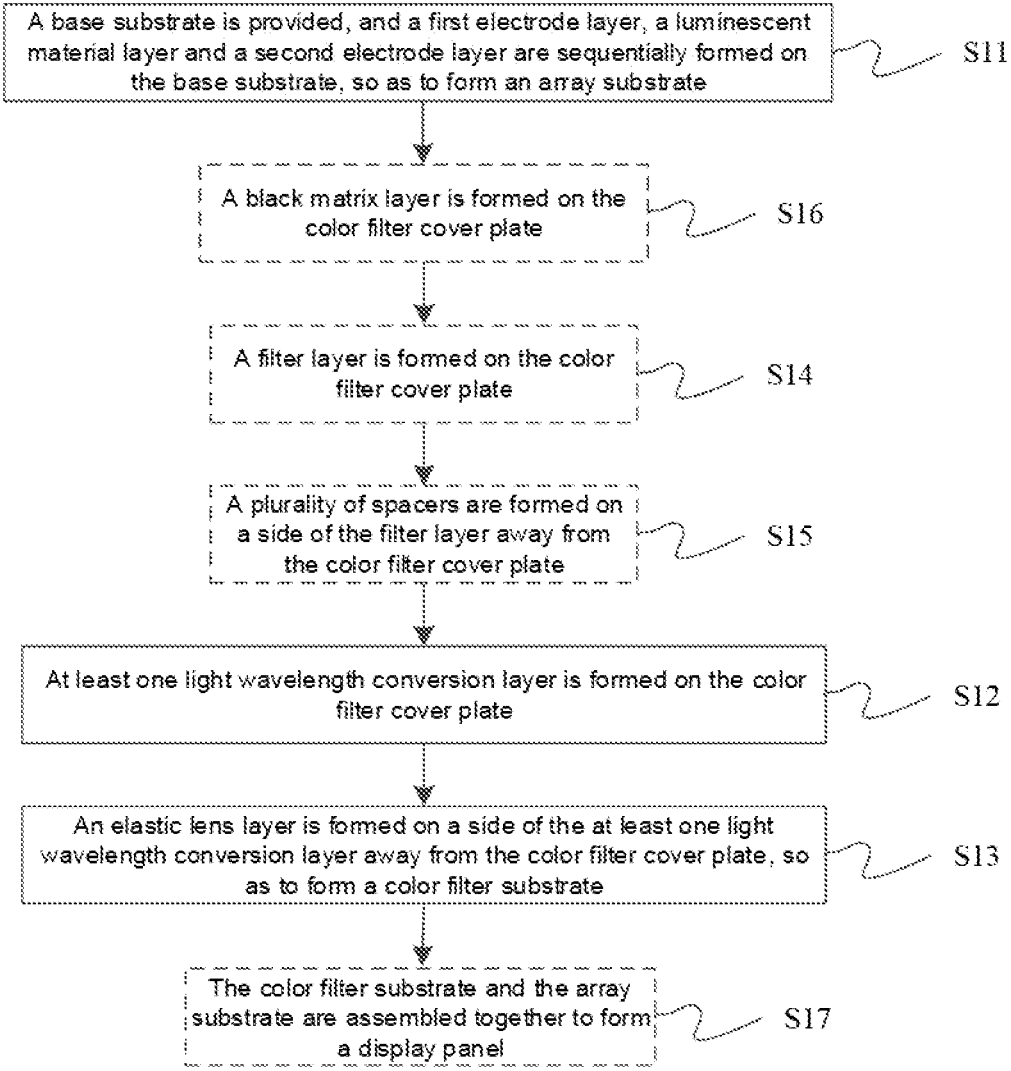
FIG. 11 schematically shows a schematic flowchart of a method of manufacturing a display panel according to some embodiments of the present disclosure.

As shown in FIG. 11, the embodiments of the present disclosure further provide a method of manufacturing a display panel, including the following steps.

In step S11, a base substrate is provided, and a first electrode layer, a luminescent material layer and a second electrode layer are sequentially formed on the base substrate so as to form an array substrate.

In step S12, a color filter cover plate is provided and at least one light wavelength conversion layer is formed on the color filter cover plate; and In step S13, an elastic lens layer is formed on a side of the at least one light wavelength conversion layer away from the color filter cover plate so as to form a color filter substrate.

As described above, the elastic lens layer 32 is used to converge the excitation light emitted from the luminescent material layer 22.

In some embodiments, before the step S13, the method may further include step S14 and step S15.

In step S14, a filter layer is formed on the color filter cover plate.

In step S15, a plurality of spacers are formed on a side of the filter layer away from the color filter cover plate, and an opening region is provided between adjacent spacers.

In this embodiment, the at least one light wavelength conversion layer is formed in the opening region, and adjacent light wavelength conversion layers are spaced apart by the spacers.

In the step S14, the filter layer may be formed by depositing a plurality of optical interference film layers and patterning by means such as photolithography, or by evaporation using a high-precision metal mask. The optical interference film layer may be, for example, a film system structure formed by alternating high and low refractive index materials such as SiO2/TiO2. In the method described above, the spacer may be made of a light-blocking material (absorbent or reflective material), which may not only prevent a cross color between adjacent pixels, but also increase a thickness of the light wavelength conversion layer. When the at least one light wavelength conversion layer includes a first color light wavelength conversion layer 31A and a second color light wavelength conversion layer 31B, the first color light wavelength conversion layer 31A and the second color light wavelength conversion layer 31B may be respectively formed in two sub-steps. When a third color light wavelength conversion layer 31C is provided in the display panel, the third color light wavelength conversion layer 31C may be formed of, for example, a transparent protective adhesive, which may be used for planarization. For a substrate with a high level difference, an embossing method may be used to improve a flatness effect, and a specific implementation is not limited.

In some embodiments, before forming the filter layer, the method further includes step S16.

In step S16, a black matrix layer is formed on the color filter cover plate, and the filter layer is located on a side of the black matrix layer away from the color filter substrate. As described above, the black matrix layer BM may be used as an alignment reference for forming the spacer 34A, the light wavelength conversion layer, the elastic lens layer 32 and other structures.

In some embodiments, the method may further include step S17.

In step S17, the color filter substrate and the array substrate are assembled together to form a display panel. The step S17 may be performed by, for example, bonding or the like.

More specifically, the above step S11 may further include forming various film layer structures on the base substrate. For example, a thin film transistor structure and a thin film encapsulation may be formed on the base substrate.

Optional steps are shown in dashed boxes in FIG. 11.

Figure 4:
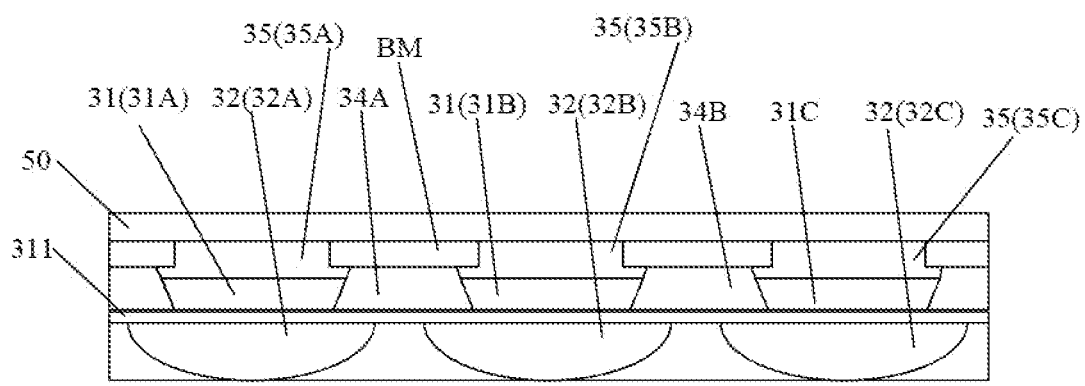
FIG. 4 shows a schematic diagram of a color filter substrate of a display panel according to some embodiments of the present disclosure.

As described above, the display panel according to the embodiments of the present disclosure may have a dual-substrate structure or a single-substrate structure. The display panel with the dual-substrate structure (that is, the display panel provided with both the base substrate and the color filter substrate) may be manufactured, for example, by using the manufacturing method shown in FIG. 11. In this case, the light wavelength conversion layer may be formed by evaporation. FIG. 4 shows an example of the structure of the color filter substrate.

Figure 12:
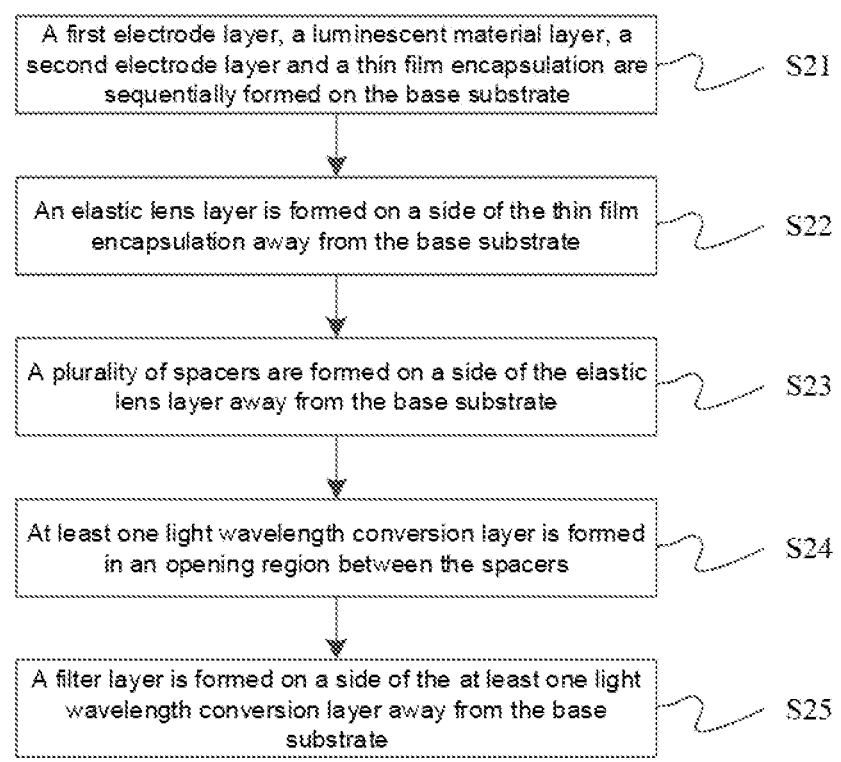
FIG. 12 schematically shows a schematic flowchart of a method of manufacturing a display panel according to some other embodiments of the present disclosure.

As shown in FIG. 12, the embodiments of the present disclosure further provide another method of manufacturing a display panel, including step S21 to step S25.

In step S21, a first electrode layer, a luminescent material layer, a second electrode layer and a thin film encapsulation are sequentially formed on the base substrate.

In step S22, an elastic lens layer is formed on a side of the thin film encapsulation away from the base substrate.

In step S23, a plurality of spacers are formed on a side of the elastic lens layer away from the base substrate.

In step S24, at least one light wavelength conversion layer is formed in an opening region between the spacers.

In step S25, a filter layer is formed on a side of the at least one light wavelength conversion layer away from the base substrate.

In the method described above, the light wavelength conversion layer may be manufactured by inkjet printing, which is advantageous for the production of the large-sized display panel. The arrangement of the spacers is beneficial to form a cavity for accommodating a material fluid to be printed, and is helpful to achieve the manufacture of the light wavelength conversion layer by inkjet printing.

In some embodiments, as described above, after the thin film encapsulation (e.g., including the first inorganic encapsulation layer 25, the organic encapsulation layer 26 and the second inorganic encapsulation layer 27) is formed on the base substrate 30, a layer of flexible medium 29 may be firstly formed on the side of the thin film encapsulation away from the thin film encapsulation, an accommodating opening is formed in the flexible medium 29, and then the elastic lens layer 32 is formed in the accommodating opening.

In some embodiments, a surface of one or more of the at least one light wavelength conversion layer on the side away from the base substrate is formed with a shape of a converging lens surface. The shape may be formed by a surface shape of the material fluid during the inkjet printing process, and the shape is beneficial to increase an intensity of light emitted from the light wavelength conversion layer.

In the embodiments of the present disclosure, after step S25, a protective layer may be further formed on a side of the filter layer away from the base substrate. The display panel manufactured by the method shown in FIG. 12 may have, for example, the single-substrate structure.

In the embodiments of the present disclosure, the light wavelength conversion layer may contain, for example, quantum dots, quantum rods, phosphors, and the like. As an example, quantum dots (with a size of 2 nm to 30 nm in size, typically spherical) and particle scatters much larger than the quantum dots in size may be provided in the light wavelength conversion layer to enhance a light conversion efficiency and an uniformity of the quantum dots.

In the embodiments of the present disclosure, the elastic lens layer 32 may be manufactured by patterning. For example, the elastic lens layer 32 may be formed from a photoresist material by photolithography.

In some embodiments, for example, the spacers 34A and 34B may be black, gray or white. The spacers 34A and 34B may be used to reflect or absorb the excitation light, thereby reducing the optical interference between adjacent sub-pixels. For example, the spacers 34A and 34B may be made of a photoresist material, and in order to enhance the effect, components such as silicon dioxide or titanium dioxide may be mixed therein to enhance performance parameters such as color, reflectivity and the like.

The embodiments of the present disclosure further provide an electronic device, including the transparent display panels 100, 100', 100" described in any of the foregoing embodiments. For example, the electronic device may be any display device, such as a smart phone, a wearable smart watch, smart glasses, a tablet computer, a television, a monitor, a laptop computer, a digital photo frame, a navigator, a car monitor, an e-book, and the like.

Although the present disclosure is described with reference to the accompanying drawings, the embodiments disclosed in the accompanying drawings are intended to illustrate the embodiments of the present disclosure, and should not be construed as limiting the present disclosure. The size ratios in the drawings are only illustrative, and should not be construed as limiting the present disclosure.

The embodiments described above merely illustrate the principle and structure of the present disclosure, and are not intended to limit the present disclosure. Those skilled in the art should understand that any changes and improvements made to the present disclosure without departing from the general concept of the present disclosure fall within the scope of the present disclosure. The protection scope of the present disclosure shall be determined by the scope defined by the claims of the present disclosure.

What is claimed is:

1. A display panel, comprising:
    a base substrate;
    a first electrode layer arranged on the base substrate;
    a luminescent material layer located on a side of the first electrode layer away from the base substrate and configured to emit an excitation light;
    a second electrode layer located on a side of the luminescent material layer away from the base substrate; and
    at least one light wavelength conversion layer located on a side of the second electrode layer away from the base substrate and configured to convert the excitation light emitted from the luminescent material layer into a light having a predetermined color,
    wherein, the display panel further comprises an elastic lens layer located on the side of the second electrode layer away from the base substrate and on a side of the light wavelength conversion layer facing the base substrate, and the elastic lens layer is configured to converge the excitation light emitted from the luminescent material layer; and
    wherein the display panel further comprises a thin film encapsulation located between the elastic lens layer and the second electrode layer, a gas or a flexible medium is filled around the elastic lens layer between the thin film encapsulation and the light wavelength conversion layer, and a refractive index of the gas or the flexible medium is less than a refractive index of the elastic lens layer.

2. The display panel of claim 1, wherein the elastic lens layer has an elastic restoring force of 200 MPa to 600 MPa.

3. The display panel of claim 1, further comprising a protective layer located between the elastic lens layer and the light wavelength conversion layer, wherein a height of the elastic lens layer in a direction perpendicular to the base substrate is equal to a distance from a surface of the protective layer on a side facing the base substrate to a surface of the thin film encapsulation on a side away from the base substrate in the direction perpendicular to the base substrate.

4. The display panel of claim 1, wherein the at least one light wavelength conversion layer comprises a first color light wavelength conversion layer and a second color light wavelength conversion layer, the elastic lens layer comprises a first converging lens and a second converging lens, an orthographic projection of the first converging lens on the base substrate at least partially overlaps an orthographic projection of the first color light wavelength conversion layer on the base substrate, and an orthographic projection of the second converging lens on the base substrate at least partially overlaps an orthographic projection of the second color light wavelength conversion layer on the base substrate.

5. The display panel of claim 4, wherein adjacent first color light wavelength conversion layer and second color light wavelength conversion layer are spaced apart by a spacer in a direction parallel to the base substrate.

6. The display panel of claim 5, wherein an inner angle formed between a side slope surface of the spacer facing the first color light wavelength conversion layer or the second color light wavelength conversion layer and a surface of the spacer on a side facing the base substrate is less than 90 degrees.

7. The display panel of claim 6, wherein an area of an orthographic projection of the surface of the spacer on the side facing the base substrate on the base substrate is greater than an area of an orthographic projection of a surface of the spacer on a side away from the base substrate on the base substrate.

8. The display panel of claim 7, wherein a height h of the first converging lens in the direction perpendicular to the base substrate satisfies:

$$h \le \frac{W}{2 \times \tan\theta 1}$$

where W represents a sum of a width of the first color light wavelength conversion layer and a width of the spacers on both sides adjacent to the first color light wavelength conversion layer, and θ1 represents a predetermined divergence angle of the excitation light emitted from the luminescent material layer.

9. The display panel of claim 4, wherein the excitation light emitted from the luminescent material layer has a third color, the display panel further comprises a third color light transmission layer located on the side of the second electrode layer away from the base substrate and configured to transmit the excitation light, the elastic lens layer further comprises a third converging lens, and an orthographic projection of the third converging lens on the base substrate at least partially overlaps an orthographic projection of the third color light transmission layer on the base substrate.

10. The display panel of claim 4, further comprising a filter layer located on a side of the at least one light wavelength conversion layer away from the base substrate and configured to filter an exit light from the first color light wavelength conversion layer and an exit light from the second color light wavelength conversion layer, wherein the light filter layer is a thin film filter.

11. The display panel of claim 10, wherein the filter layer comprises a long pass filter film, an orthographic projection of the long pass filter film on the base substrate covers the orthographic projection of the first color light wavelength conversion layer on the base substrate and the orthographic projection of the second color light wavelength conversion layer on the base substrate, a pass band wavelength range of the long pass filter film at least partially covers a desired exit light wavelength range of the first color light wavelength conversion layer and a desired exit light wavelength range of the second color light wavelength conversion layer, and a stop band wavelength range of the long pass filter film covers a wavelength range of the excitation light emitted from the luminescent material layer.

12. The display panel of claim 10, wherein the filter layer comprises:
   a first color filter film, wherein an orthographic projection of the first color filter film on the base substrate covers the orthographic projection of the first color light wavelength conversion layer on the base substrate, and the first color filter film is configured to filter out a light of wavelengths other than the desired exit light wavelength range of the first color light wavelength conversion layer; and
   a second color filter film, wherein an orthographic projection of the second color filter film on the base substrate covers the orthographic projection of the second color light wavelength conversion layer on the base substrate, and the second color filter film is configured to filter out a light of wavelengths other than the desired exit light wavelength range of the second color light wavelength conversion layer.

13. The display panel of claim 4, wherein a surface of one or more of the at least one light wavelength conversion layer on a side away from the base substrate has a shape of a converging lens surface.

14. The display panel of claim 10, further comprising a color filter cover plate located on a side of the filter layer away from the base substrate.

15. An electronic device comprising the display panel of claim 1.

16. A method of manufacturing a display panel, comprising:
   providing a base substrate and sequentially forming a first electrode layer, a luminescent material layer and a second electrode layer on the base substrate, so as to form an array substrate;
   providing a color filter cover plate and forming at least one light wavelength conversion layer on the color filter cover plate; and
   forming an elastic lens layer on a side of the at least one light wavelength conversion layer away from the color filter cover plate, so as to form a color filter substrate,
   wherein, the elastic lens layer is located on a side of the second electrode layer away from the base substrate and on a side of the light wavelength conversion layer facing the base substrate, and the elastic lens layer is configured to converge an excitation light emitted from the luminescent material layer;
   wherein the method further comprises: before forming the at least one light wavelength conversion layer,
   forming a filter layer on the color filter cover plate; and
   forming a plurality of spacers on a side of the filter layer away from the color filter cover plate, wherein an opening region is arranged between the spacers; and
   wherein, the at least one light wavelength conversion layer is formed in the opening region, and adjacent light wavelength conversion layers are spaced apart by the spacers.

17. The method of manufacturing the display panel of claim 16, further comprising: before forming the filter layer,
   forming a black matrix layer on the color filter cover plate,
   wherein, the filter layer is located on a side of the black matrix layer away from the color filter substrate.

18. The method of manufacturing the display panel of claim 16, further comprising:
   assembling the color filter substrate and the array substrate to form the display panel.

* * * * *